(12) United States Patent
Haberer et al.

(10) Patent No.: US 6,995,083 B2
(45) Date of Patent: Feb. 7, 2006

(54) METHOD FOR PRODUCING AN ELECTRICAL AND/OR MECHANICAL CONNECTION BETWEEN FLEXIBLE THIN-FILM SUBSTRATES

(75) Inventors: Werner Haberer, St. Ingbert (DE); Martin Schuttler, Saarbrucken (DE); Hans-Jorg Beutel, Unterensingen (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 124 days.

(21) Appl. No.: 10/333,205
(22) PCT Filed: Jul. 18, 2001
(86) PCT No.: PCT/EP01/08268

§ 371 (c)(1),
(2), (4) Date: Aug. 4, 2003

(87) PCT Pub. No.: WO02/07486

PCT Pub. Date: Jan. 24, 2002

(65) Prior Publication Data

US 2004/0025332 A1 Feb. 12, 2004

(30) Foreign Application Priority Data

Jul. 19, 2000 (DE) .......................................... 100 35 175

(51) Int. Cl.
*H01L 21/44* (2006.01)

(52) U.S. Cl. ...................................................... 438/613
(58) Field of Classification Search ................. 438/660, 438/613; 428/639, 85; 424/422; 257/735, 257/692, 722, 79; 228/246; 310/313 D; 134/1.3
See application file for complete search history.

(56) References Cited

U.S. PATENT DOCUMENTS

| 4,962,416 | A | * | 10/1990 | Jones et al. .................. 257/722 |
| 5,235,235 | A | * | 8/1993 | Martin et al. ........... 310/313 D |
| 2003/0150477 | A1 | * | 8/2003 | Suzuki ........................ 134/1.3 |

FOREIGN PATENT DOCUMENTS

| DE | 3512237 A1 | 12/1985 |
| DE | 3703694 A1 | 8/1988 |
| DE | 4131413 A1 | 10/1992 |
| DE | 19831876 A1 | 2/1999 |

* cited by examiner

*Primary Examiner*—Craig A. Thompson
*Assistant Examiner*—Monica D. Harrison

(74) *Attorney, Agent, or Firm*—Burns, Doane, Swecker & Mathis, LLP

(57) ABSTRACT

Disclosed is a method for producing an electrical and/or mechanical connection between at least two flexible thin-film substrates, referred to as flexible substrates hereinafter as well as a corresponding contact arrangement. The invention is distinguished by the to-be-joined flexible substrates, which each are provided with at least one opening at the point of connection being positioned in such a manner that the opening of one flexible substrate is congruent with the opening of another flexible substrate, by a bonding element being positioned on both sides of each congruently aligned opening, and by both the bonding elements being joined to a bonding connection by being pressed against each other and at least partially enclosing the peripheral edges of the openings facing said bonding elements.

14 Claims, 4 Drawing Sheets

METHOD FOR PRODUCING AN ELECTRICAL AND/OR MECHANICAL CONNECTION BETWEEN FLEXIBLE THIN-FILM SUBSTRATES

FIELD OF THE INVENTION

The present invention relates to a method for producing an electrical and/or mechanical connection between at least two flexible thin-film substrates as well as to a corresponding contact arrangement.

BACKGROUND OF THE INVENTION

Thin-film substrates or commonly also called flexible substrates are flexible sheet substrates that are usually made of a plane organic material and provide plane-applied electrical conductor structures onto which often electrical components are placed. Flexible substrates processed in this manner, with a substrate thickness of just approximately 10 µm, find a variety of applications in a suited manner for connecting electronic components electrically or mechanically. Production of these electrically and mechanically conductive connections usually occurs using a method generally referred to as "bonding". For the technique of bonding, see printed publication DE 198 31 876 A1 to which, moreover, reference is regarding the terminology used herein. Furthermore, DE 37 03 694 A1 gives exact details regarding the so-called ball bonding method. Also dealing with herewith is DE 414 31 4123 A1, which describes a ball-based method of bonding for semiconductor chips and the subject matter of which is the production of tower-like connecting structures.

In addition to connecting microelectronic components on flexible substrates processed with conductor structures, two or a plurality of flexible substrates are often connected to each other, particularly in the field of mounting and connecting techniques (AVT) to form highly complex microsystems. According to the present state of the art, this occurs by means of gluing, soldering, welding or thermocompression bonding.

When gluing at least two flexible substrates, a conductive adhesive in the form of electrically conductive polymers, that are applied to certain locations on the to-be-connected flexible substrates, is used. When contacting the to-be-connected flexible substrates, there is, however due to the capillary forces between the substrates, only a difficult to control flow of the viscous adhesive. If nonetheless, flexible substrates with filigree-designed conductor structures are to be connected using gluing techniques, it is necessary to resort to complicated measures, which are inevitably accompanied by high costs.

On the other hand, joining two flexible substrates using prior art soldering techniques only permits producing an electrical connection, because metallizations applied in the form of electrical conductor structures must be present on the surfaces of the flexible substrates in order to produce soldering connections between two flexible substrates. Thus, it is impossible to join flexible substrates with electrical conductor substrates made of conductive polymers using the as such prior art soldering methods. Moreover, as in medicine, only biocompatible material can be employed, soldering is unsuited due to the soldering materials and their process products.

With the prior art welding techniques, it is presently impossible to produce both a mechanical as well as an electrical contact in a single process. Thus, utilizing the usual materials to connect two flexible substrates requires at least two different joining steps, in which, on the one hand, plastic welding and, on the other hand, metal welding is employed. Metallization welding requires that the conductive layer has a certain minimum thickness, which usually is a multiplicity of the thickness of a thin-film substrate metallization such as generated by sputtering or vapor depositing.

In this context, DE 35 12 237 A1 discloses a connecting method for producing a multi-layer flexible circuit arrangement in which two adjacent circuit carriers are joined by means of ultrasonic welding. With regard to the ultrasonic welding method of joining, the aforecited drawbacks need to be mentioned.

Finally, similar to the soldering methods, the thermocompression bonding method requires a metallization layer, thus making production of a solely mechanical connection of flexible substrates, which usually are made of organic materials, by means of thermocompression bonding impossible.

SUMMARY OF THE INVENTION

The object of the present invention is to improve a method for producing an electrical and/or mechanical connection between at least two flexible thin-film substrates respectively flexible substrates as well as a corresponding contact arrangement in such a manner that the aforecited drawbacks of the aforementioned joining methods can be overcome. In particular, at least two flexible substrates should be joinable in a spatially precise arrangement. The to-be-utilized joining materials should be biocompatible so that use in medical applications is possible. Moreover, the joining technique should be applicable independent of the presence of metallization layers so that even solely mechanical joining of at least two flexible substrates is possible. The invented method respectively the invented contact arrangement should be easy and inexpensive to produce.

The solution of the object on which the present invention is based is set forth herein. A contact arrangement that is producible with the invented method also is described herein. Advantageous features that further improve the inventive idea are contained in the description of the invention with reference to the figures.

A key element of the present invention is that a method for producing an electrical and/or mechanical connection between at least two flexible thin-film substrates is designed in that the to-be-joined flexible substrates, which each have at least one opening at one connecting point, are positioned in such a manner that the opening of one flexible substrate is congruent with the opening of the other flexible substrate. Usually the openings at the desired connecting point have a diameter of about 50 µm so that highly exact, reciprocal alignment of the single flexible substrates is possible just by precise adjustment of two or a plurality of to-be-connected flexible substrates based on the to be congruently aligned openings. A bonding element is positioned on both sides of the congruently aligned openings respectively, which are then joined by being pressed against each other to form a bonded connection, with the peripheral edges of the openings facing the bonding elements, respectively, being at least partially enclosed by the bonding elements deformed by the bonding process. Usually the bonding process occurs with the aid of a bonding capillary, which provides one bonding element, respectively, in the form of a bond ball and deforms the bonded connection pressed together while being fed thermal and ultrasonic energy, to a so-called bond bump.

The invented method permits connecting two or a plurality of flexible substrates vertically one on top of the other. Biocompatible materials can be employed, for example using gold bump elements.

If the openings inside the respective to-be-connected flexible substrates are located in regions in which no electrically conductive conductor structures are provided, the bonded connection produced with the invented method can only join the flexible substrates fast mechanically. However, if the flexible substrates are provided with an electrically conductive layer in the region of the openings, these layers are connected electrically by the electrically conductive bonding material.

Connecting two or a plurality of flexible substrates requires at least two bonding elements which are joined to an intimate bonded connection through the flexible substrates made congruent by the openings. Provision of the two bonding elements may occur by means of a bonding capillary. Simultaneously processing two bonding elements requires two bonding capillaries placed opposite the openings of the congruent, to-be-joined flexible substrates in order to join the bonding elements at the openings subjected to pressure as well as fed thermal and ultrasonic energy.

Another possible manner of producing the invented contact arrangement provides that a bonding element is first placed on an ancillary substrate, which is heatable, with the aid of a bonding capillary and deformed into a bonding bump. Then the to-be-joined flexible substrates are positioned congruently with their openings over the bonding bump, which is lying on the ancillary substrate. Subsequently a further bonding ball is placed vertically from above on the openings of the stacked flexible substrates with the aid of the bonding capillary and joined with the bonding bump lying on top of the ancillary substrate while being fed thermal and ultrasonic energy. Optionally, a connecting line to the top bonding element respectively bonding ball may remain after removal of the bonding capillary.

The aforedescribed methods are also suited, depending on the size of the openings and the diameter of the employed bonding elements respectively bonding balls, for joining three or more flexible substrates to each other.

Of course, the aforedescribed mode of proceeding can also be applied in such a manner that an already interconnected pair of flexible substrates can be interconnected with another already interconnected pair of flexible substrates to a stack arrangement via corresponding bonded connections.

BRIEF DESCRIPTION OF THE DRAWINGS

The invention is made more apparent in the following using preferred embodiments with reference to the accompanying drawing by way of example without the intention of limiting the scope or spirit of the overall inventive idea.

DETAILED DESCRIPTION Of THE INVENTION

Figure 1:
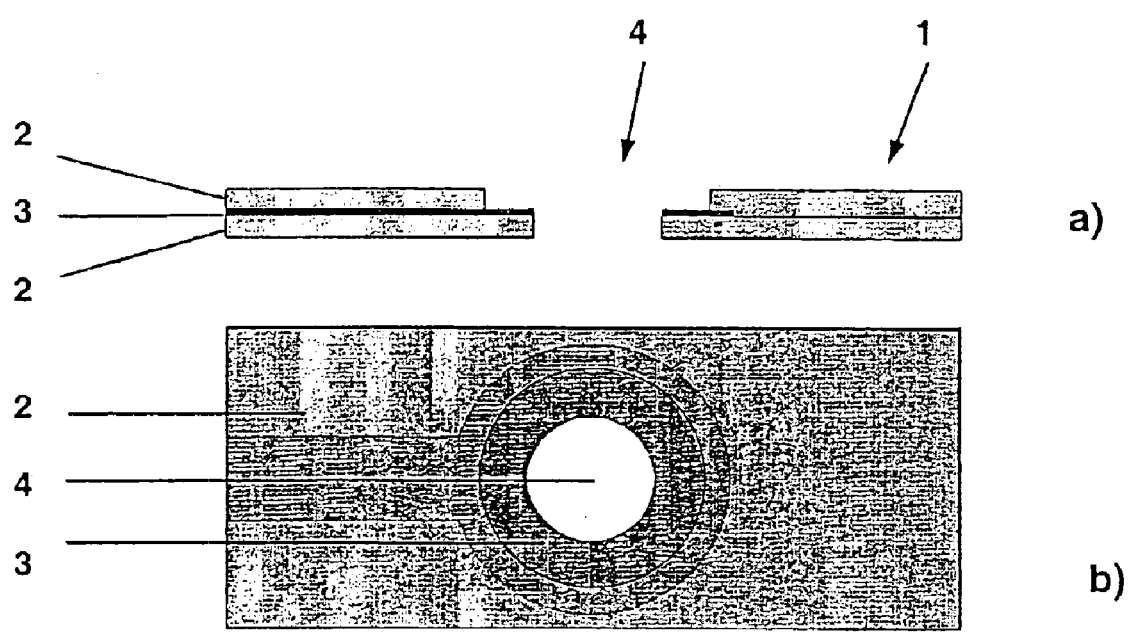
FIGS. 1a,b show a representation of a prior art flexible substrate.

In FIG. 1, detail 1a shows a lateral view of a schematic buildup of a flexible substrate 1 composed of two electrically insulating layers 2 as well as an electrically conductive layer 3 located between the electrically insulating layers 2. The layer buildup of flexible substrate 1 has a thickness usually of a few 10 $\mu$m. Moreover, an opening 4 is provided which runs through the flexible substrate 1 in such a manner that it is, on the one hand, completely surrounded by the electrically conductive layer 3 and, on the other hand, completely runs through the two electrically insulating layers 2. The top electrically insulating layer 2 is placed at a distance from the opening 4 in such a manner that a peripheral edge, which is freely accessible from above and which is of great significance for subsequent contacting, is formed about the opening 4. FIG. 1b shows a top view of the flexible substrate 1 depicted in FIG. 1a.

Figure 2:
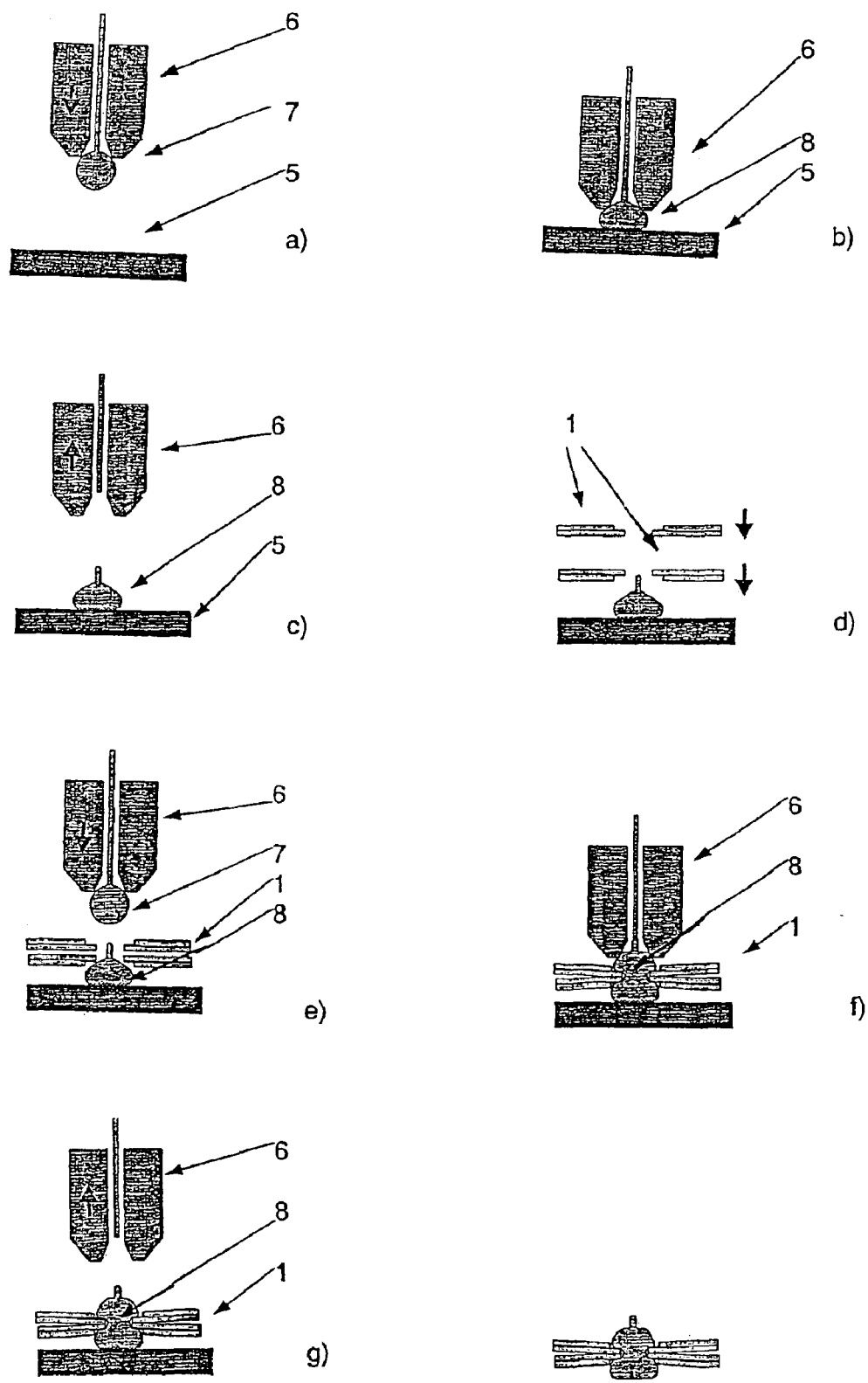
FIGS. 2a–h show steps of the method for producing a bonded connection between two flexible substrates.

In details a to h, FIG. 2 shows steps of the method according to which the production of an invented electrical and mechanical connection of two flexible substrates occurs. First according to FIG. 2a, a bonding ball 7 is placed on an ancillary substrate 5, which preferably is heatable, with the aid of a bonding capillary 6, which preferably is designed as a ball-wedge bonder. The bonding capillary 6 is connected to an ultrasonic-wave-generating unit. An electrically conductive material, preferably metal, in the form of a wire is passed through a hollow channel inside the bonding capillary 6 to the tip of the bonding capillary 6 where the bonding material melts to a ball 7 by means of being fed thermal energy respectively by means of spark discharge. In the next step of the method according to FIG. 2b, the bonding ball 7 formed at the tip of the bonding capillary 6 is pressed with force against the ancillary substrate 5 while being fed ultrasonic energy acting on the bonding ball 7 via bonding capillary 6. In this manner, the bonding ball 7 is deformed to a bonding bump 8.

In the step of the method according to FIG. 2c, the bonding capillary 6 is withdrawn and the wiring of bonding bump 8 is ripped off. Only the bonding bump 8 remains on the ancillary substrate 5. In another step according to FIG. 2d, the to-be-joined flexible substrates 1 are centered and held by means of their openings 4, respectively, above the bonding bump 8 placed on the ancillary substrate 5. According to FIG. 2e, once again a bonding ball 7 is placed on the stacked flexible substrates 1. According to FIG. 2f, the second bonding bump 8 is bonded onto the first bonding bump 8, which lies immediately on the ancillary substrate 5, in such a manner that the flexible substrates 1 located between the two bonding bumps are joined fast. After completion of this bonding on, the bonding capillary 6 is withdrawn according to FIG. 2g and the bonding wire is ripped off the top bonding bump. Finally the bottom bonding bump is removed from the ancillary substrate 5 mechanically. The result is an intimate mechanical and electrical connection between the flexible substrates 1 according to FIG. 2h.

The contact arrangement produced with this method is distinguished in particular by two joined bonding bumps 8 which in a deformed, bonded state enclose the peripheral edges of the openings of the two connected flexible substrates. In this manner, the flexible substrates are joined at the point of connection to a fast, electrically intimate connection.

Figure 3:
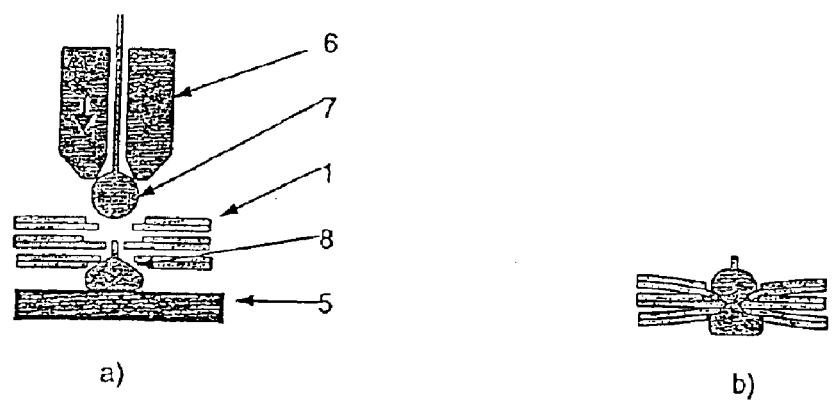
FIG. 3 shows steps of the method for producing a connection of more than two flexible substrates.

It is also possible to join more than two flexible substrates with the aid of two bonding bumps as is shown in FIGS. 3a and b. Once again, the to-be-joined flexible substrates 1 with their respective openings are arranged congruently and centered relative to the first bonding bump 8 and held accordingly. Then bonding ball 7 is placed according to the bonding procedure of FIG. 2e with the aid of the bonding capillary 6 according to the depiction in FIG. 3a. Following corresponding application of force and feeding of thermal as well as ultrasonic energy, the two bonding bumps 8 are joined and form a bonding connection according to FIG. 3b after the bonding capillary 6 has been withdrawn and the bonding wire has been ripped off.

Figure 4:
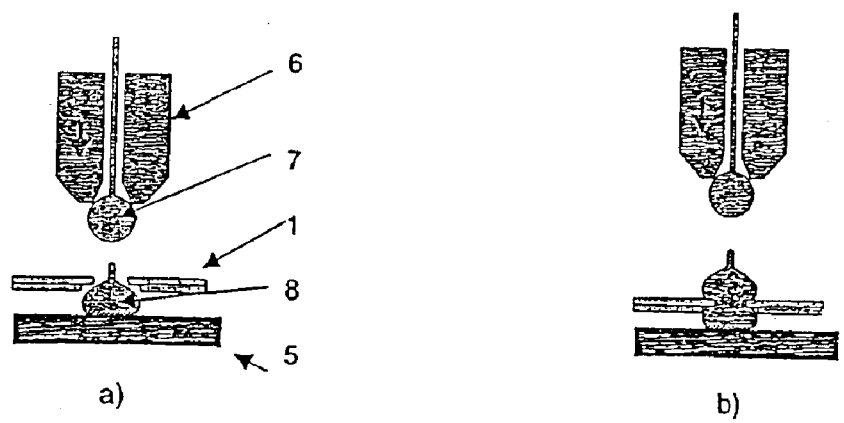
FIGS. 4a–d show steps of the method for producing a towerlike contact finger with the aid of joined stacked bonding elements.
Figure 4:
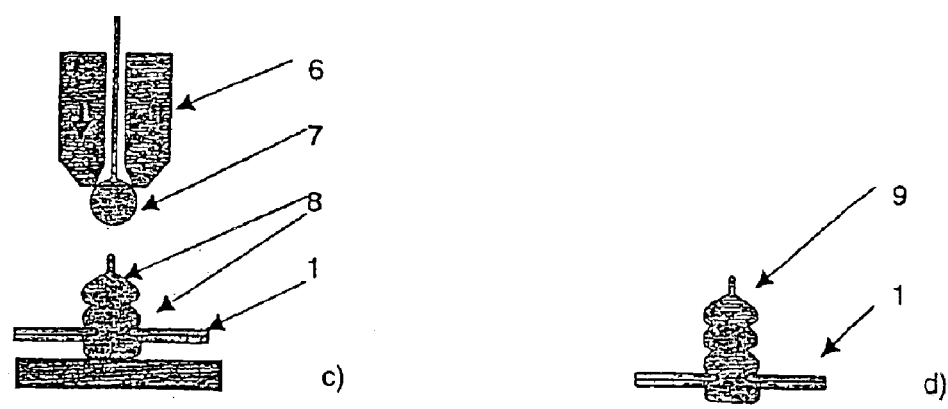
Figure 5:
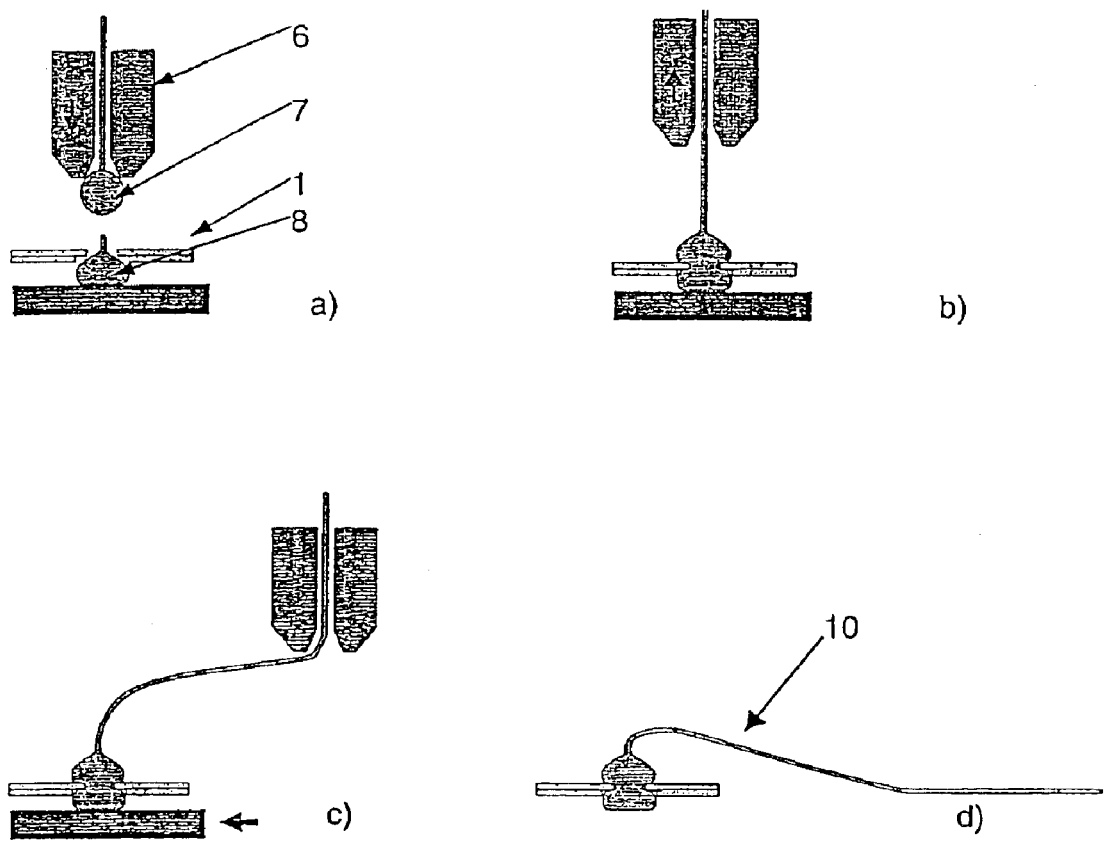
FIGS. 5a–d show steps of the method for producing a bonded connection with an electric supply line connected immediately thereto.

FIGS. 4a to d show an advantageous variant of the method with which a three-dimensional multi-electrode array composed of single contact fingers can be produced. Thus, according to FIG. 4a, a bonding bump 8 obtained by means of the method steps shown in FIGS. 2a to c is placed on an ancillary substrate 5. A flexible substrate 1 is placed centered corresponding to its opening 4 and provided with another bonding ball 7 with the aid of the bonding capillary 6. FIG. 4b shows the two joined bonding bumps 8. Now a further bonding ball 7 is conveyed onto the bonded connection with the bonding capillary 6 according to FIG. 4b and in the same manner again a further bonding ball 7 according to FIG. 4c. The final result is a tower structure 9 composed of a plurality of bonding bumps 8 arranged on top of each other. Such a type tower structure 9 can, for example, be utilized as a penetrating nerve electrode in medicine or biology. Multiple tower structures placed on one substrate yield a three-dimensional multi-electrode array which, for example can be used for coupling cortical nerve tissue.

It is also possible to join different flexible substrates at different distances fast with the aid of the tower structures 9. The single bonding bumps, which can be joined immediately, serve as spacers.

FIGS. 5a to d show how a bonding connection composed of two bonding bumps 8 can be connected to an electrical supply line 10. Contrary to the preceding variants of the method in which the bonding wired is ripped off when the bonding capillary 6 is withdrawn, according to the method variant of FIG. 5b the bonding capillary 6 is withdrawn without ripping off of the bonding wire. By corresponding lateral swinging of the bonding capillary 6 relative to the ancillary substrate 5 respectively lateral movement of the ancillary substrate 5 relative to the bonding capillary 6, the bonding wire connected to the top bonding bump is deformed laterally and can serve as an electrical supply line according to FIG. 5d.

The aforedescribed invented manner of producing an electrical and/or mechanical connection between at least two flexible thin-film substrates is particularly utilized in the fabrication of prototypes and small series of electronics on flexible substrates. Especially interesting technical fields herefor are military technology and space technology. As a particularly special feature, attention is called once more to its biocompatibility if the utilized materials including the bonding materials are made of biocompatible material. This, in particular, permits using flexible substrates formed with the invented contact arrangement in medicine, especially in the field of electronic implants.

LIST OF REFERENCES

| | |
|---|---|
| 1 | flexible substrate |
| 2 | electrically insulating layer |
| 3 | electrically conductive layer |
| 4 | opening |
| 5 | ancillary substrate |
| 6 | bonding capillary |
| 7 | bonding ball |
| 8 | bonding bump |
| 9 | tower structure |
| 10 | bonding wire |

What is claimed is:

1. A method for producing an electrical and/or mechanical connection between at least two flexible thin-film substrates, comprising positioning said to-be-joined flexible substrates, which each have an opening at the point of connection, in such a manner that said opening of one flexible substrate is congruent with the opening of another flexible substrate, positioning a bonding element on both sides of each congruently aligned opening, and joining both said bonding elements to a bonding connection by being pressed against each other and at least partially enclosing the peripheral edges of said openings facing said bonding elements.

2. A method according to claim 1, wherein said bonding elements are provided in the form of a bonding ball by a bonding capillary respectively by a ball-wedge bonder.

3. A method according to claim 1, wherein a first bonding element is placed on an ancillary substrate.

4. A method according to claim 3, wherein said ancillary substrate is heated and said bonding element is pressed onto said ancillary substrate and is deformed to a bond bump while being fed ultrasonic energy.

5. A method according to claim 3, wherein said congruently aligned openings of said to-be-joined flexible substrates are positioned above said first bonding element, a second bonding element is pressed through said opening against said first bonding element lying on said ancillary substrate and joined while fed heat and ultrasonic energy and following the joining said ancillary substrate is removed.

6. A method according to claim 5, wherein before removal of said ancillary substrate at least one further flexible substrate is connected with the already joined flexible substrates in that said opening of said further flexible substrate is positioned over said second bonding element and is joined by means of a third bonding element through said opening of said other flexible substrate against said second bonding element.

7. A method according to claim 6, wherein the procedure for obtaining a towerlike arrangement, a so-called stack arrangement, is repeated by a plurality of joined flexible substrates.

8. A method according to claim 1, wherein electrically conductive layers are provided in said flexible substrates, in order to connect said electrically conductive layers between two flexible substrates, said openings are placed in said flexible substrates in such a manner that said electrically conductive layers end at the peripheral edges of said openings in such a manner that the bonding connection produces an electrical contact between said electrical layers of immediately adjacent flexible substrates through said openings.

9. A contact arrangement between at least two flexible thin-film substrates, wherein said flexible substrates are each provided with at least one opening at a point of connection, which openings are arranged congruently at each other, bonding elements are provided on both sides of said two openings, and said bonding elements are joined in such a manner that an intimate bonding connection is produced and that said bonding elements at least partially enclose the peripheral edges of said openings facing said bonding elements respectively.

10. A contact arrangement according to claim 9, wherein said flexible substrates are provided with at least one electrically conductive layer which has at least one opening running through it and at least partially encloses said peripheral edge of said opening and said bonding connection produces an electrical connection between said electrically conductive layers of two separate, joined flexible substrates.

11. A contact arrangement according to claim 9, wherein said flexible substrates have a thickness of a few 10 μm and said openings have a diameter of approximately 10 μm.

12. A contact arrangement according to claim 9, wherein a plurality of bonding elements are provided, which are joined immediately stacked one on top of the other and which form a type of towerlike contact fingers projecting vertically over a substrate.

13. A contact arrangement according to claim 12, wherein a plurality of said contact fingers are provided on a flexible substrate and serve as electrodes or spacing elements for joining further flexible substrates relative to said present flexible substrate.

14. A contact arrangement according to claim 9, wherein at least the bonding element last placed on said contact arrangement is connected one-piece to a bonding wire as a supply wire.

* * * * *